US012442078B2

(12) United States Patent
Yang et al.

(10) Patent No.: US 12,442,078 B2
(45) Date of Patent: Oct. 14, 2025

(54) WORKPIECE PROCESSING APPARATUS WITH GAS SHOWERHEAD ASSEMBLY

(71) Applicants: Mattson Technology, Inc., Fremont, CA (US); Beijing E-Town Semiconductor Technology Co., Ltd., Beijing (CN)

(72) Inventors: Michael Yang, Palo Alto, CA (US); Yun Yang, Berwyn, PA (US); Manuel Sohn, Ulm (DE); Silke Hamm, Laupheim (DE); Alex Wansidler, Blaustein (DE); Dieter Hezler, Lonsee-Halzhausen (DE); Rolf Bremensdorfer, Bibertal (DE)

(73) Assignees: Beijing E-Town Semiconductor Technology Co., Ltd, Beijing (CN); Mattson Technology, Inc., Fremont (CA)

( * ) Notice: Subject to any disclaimer, the term of this patent is extended or adjusted under 35 U.S.C. 154(b) by 332 days.

(21) Appl. No.: 17/549,102

(22) Filed: Dec. 13, 2021

(65) Prior Publication Data

US 2022/0195601 A1 Jun. 23, 2022

Related U.S. Application Data

(60) Provisional application No. 63/129,079, filed on Dec. 22, 2020.

(51) Int. Cl.

| | |
|---|---|
| ***C23C 16/455*** | (2006.01) |
| ***C23C 16/458*** | (2006.01) |
| ***C23C 16/48*** | (2006.01) |

(52) U.S. Cl.

CPC .. *C23C 16/45565* (2013.01); *C23C 16/45591* (2013.01); *C23C 16/4584* (2013.01); *C23C 16/481* (2013.01)

(58) Field of Classification Search

CPC ............ C23C 16/455; C23C 16/45504; C23C 16/45506; C23C 16/45508;

(Continued)

(56) References Cited

U.S. PATENT DOCUMENTS

| | | |
|---|---|---|
| 6,007,633 A | 12/1999 | Kitamura et al. |
| 6,090,210 A | 7/2000 | Balance et al. |

(Continued)

FOREIGN PATENT DOCUMENTS

| | | |
|---|---|---|
| CN | 110195215 | 9/2019 |
| TW | 201921419 A | 6/2019 |
| TW | 202034448 A | 9/2020 |

OTHER PUBLICATIONS

International Search Report and Written Opinion for Application No. PCT/US2021/062556, mailed Apr. 6, 2022, 12 pages.

*Primary Examiner* — Kurt Sweely
(74) *Attorney, Agent, or Firm* — Dority & Manning, P.A.

(57) ABSTRACT

A processing apparatus for a thermal treatment of a workpiece is presented. The processing apparatus includes a processing chamber, a workpiece support disposed within the processing chamber, a gas delivery system, and radiative heat sources for heating the workpiece. The gas delivery system includes a gas showerhead assembly that is transparent to electromagnetic radiation emitted from the one or more radiative heat sources. The gas showerhead assembly includes one or more gas diffusion mechanisms to distribute gas within the enclosure.

14 Claims, 13 Drawing Sheets

(58) Field of Classification Search
CPC ........ C23C 16/45512; C23C 16/45514; C23C 16/45563; C23C 16/45565; C23C 16/45568; C23C 16/45578; C23C 16/4558; C23C 16/45587; C23C 16/45591; C23C 16/4584; C23C 16/46; C23C 16/48; C23C 16/481; C23C 16/482; C23C 16/52; H01J 37/3244; H01J 37/32449; C30B 25/10; C30B 25/105; C30B 25/12; C30B 25/14; C30B 25/16; C30B 25/165
See application file for complete search history.

(56) References Cited

U.S. PATENT DOCUMENTS

| | | | | |
|---|---|---|---|---|
| 6,126,744 | A * | 10/2000 | Hawkins | C23C 14/547 117/85 |
| 6,301,434 | B1 * | 10/2001 | McDiarmid | C23C 16/488 219/390 |
| 6,875,273 | B2 * | 4/2005 | Katamine | C23C 16/45572 117/88 |
| 8,960,235 | B2 | 2/2015 | Carlson | |
| 9,657,845 | B2 * | 5/2017 | Shugrue | B01D 53/0446 |
| 2004/0149215 | A1 * | 8/2004 | Shao | C23C 16/45565 257/E21.29 |
| 2005/0145338 | A1 * | 7/2005 | Park | C23C 16/45565 156/345.34 |
| 2008/0053614 | A1 * | 3/2008 | Sago | C23C 16/4557 156/345.33 |
| 2009/0266300 | A1 * | 10/2009 | Lizuka | C23C 16/45572 118/728 |
| 2012/0064698 | A1 | 3/2012 | Olgado | |
| 2012/0258259 | A1 | 10/2012 | Bansal et al. | |
| 2014/0342555 | A1 | 11/2014 | Lam et al. | |
| 2016/0068955 | A1 | 3/2016 | Brillhart et al. | |
| 2016/0115595 | A1 | 4/2016 | Hwang et al. | |
| 2016/0348242 | A1 * | 12/2016 | Sung | C23C 16/45574 |
| 2017/0330728 | A1 * | 11/2017 | Bravo | H01J 37/32082 |
| 2018/0057940 | A1 * | 3/2018 | Madsen | C23C 16/505 |
| 2021/0147891 | A1 | 5/2021 | Tan et al. | |
| 2021/0285104 | A1 | 9/2021 | Kim | |

* cited by examiner

WORKPIECE PROCESSING APPARATUS WITH GAS SHOWERHEAD ASSEMBLY

PRIORITY CLAIM

The present application claims the benefit of priority of U.S. Provisional Application Ser. No. 63/129,079, titled “Workpiece Processing Apparatus with Gas Showerhead Assembly,” filed on Dec. 22, 2020, which is incorporated herein by reference.

FIELD

The present disclosure relates generally to semiconductor processing equipment, such as equipment operable to perform thermal processing of a workpiece.

BACKGROUND

Thermal processing is commonly used in the semiconductor industry for a variety of applications, including and not limited to post-implant dopant activation, conductive and dielectric materials anneal, in addition to materials surface treatments including oxidation and nitridation. Generally, a thermal processing chamber as used herein refers to a device that heats workpieces, such as semiconductor workpieces. Such devices can include a support plate for supporting one or more workpieces and an energy source for heating the workpieces, such as heating lamps, lasers, or other heat sources. During heat treatment, the workpiece(s) can be heated under controlled conditions according to a processing regime. Many thermal treatment processes require a workpiece to be heated over a range of temperatures so that various chemical and physical transformations can take place as the workpiece is fabricated into a device(s). During rapid thermal processing, for instance, workpieces can be heated by an array of lamps to temperatures from about 300° C. to about 1,200° C. over time durations that are typically less than a few minutes. Improvement in thermal processing devices are desirable to effectively measure and control workpiece temperature with a variety of desired heating schemes.

SUMMARY

Aspects and advantages of embodiments of the present disclosure will be set forth in part in the following description, or may be learned from the description, or may be learned through practice of the embodiments.

Example aspects of the present disclosure are directed to a processing apparatus for processing a workpiece, the workpiece having a top side and a back side opposite from the top side, the processing apparatus comprising: a processing chamber, having a first side and a second side opposite from the first side of the processing chamber; a workpiece support disposed within the processing chamber, the workpiece support configured to support the workpiece, wherein the back side of the workpiece faces the workpiece support; a gas delivery system configured to flow one or more process gases into the processing chamber from the first side of the processing chamber through a gas showerhead assembly, the gas showerhead assembly comprising an enclosure having a top cover and a plurality of gas injection apertures; and one or more radiative heat sources configured to heat the workpiece; wherein the gas showerhead assembly is transparent to electromagnetic radiation emitted from the one or more radiative heat sources; wherein the gas showerhead assembly comprises one or more gas diffusion mechanisms to distribute gas within the enclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
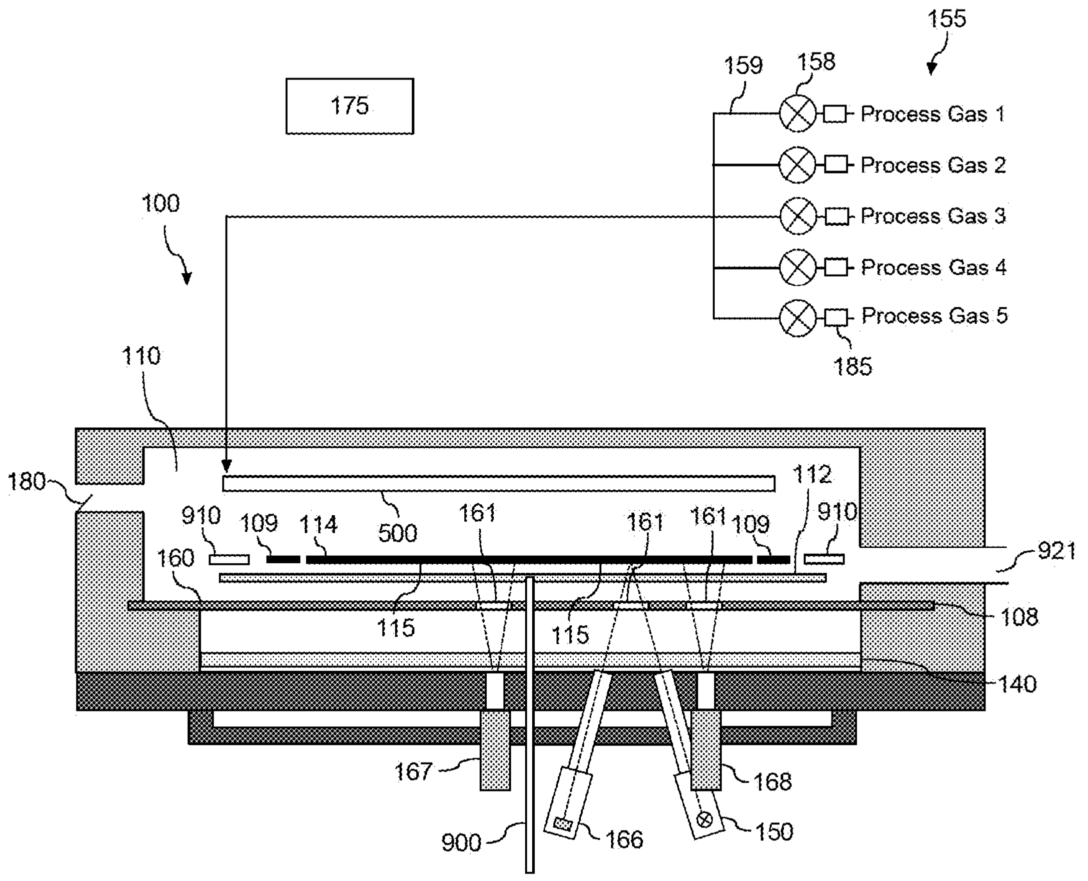
FIG. 1 depicts an example processing system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

During the manufacture of semiconductor devices, certain processes require the temporary heating of the surface of semiconductor wafers in order to, for example, promote annealing processes or other reactions that may be desired. Conventionally, this heating process, which is here referred to as rapid thermal processing (RTP), is performed by heating the wafer with some form of external energy source such as, for example, a bank of tungsten-halogen lamps or a hot-wall furnace.

Recently, there has been renewed interest in very short heating cycles for processes such as annealing of ion-implantation damage for formation of ultra-shallow junctions. For example, a high temperature process may involve quickly heating a wafer to a peak temperature then immediately allowing the wafer to cool. Such a process is usually called a spike-anneal. In a spike-anneal process, it is desirable to heat the wafer to a high peak temperature in order to achieve good damage annealing and dopant activation, but the time spent at the high temperature should be as short as possible to avoid excessive dopant diffusion.

The technology trend in the last few years has been to increase the peak temperature of the spike-anneal while simultaneously decreasing the duration of time spent at the peak temperature. This modification is usually accomplished by increasing the heating ramp rate and the cooling rate, as well as by minimizing the switch-off time of the radiant heat source. These approaches help to minimize the peak-width of the spike-anneal, i.e., the time spent by the wafer above a given threshold temperature at which significant diffusion can rapidly occur. The peak-width is often characterized by considering the time spent above a threshold temperature, which is generally defined as 50° C. below the peak temperature of the spike-anneal heating cycle.

Additional methods to further reduce spike-anneal peak-widths are still being developed. For example, certain solution have focused on modification of the energy sources including utilizing different energy sources or pulsed energy in order to heat the wafer. However, such approaches still leave wafer cooling dependent on the ambient environment. Certain other approaches have focused on physically moving the wafer away from heat sources to facilitate cooling. Still other approaches have included utilizing certain gases in the processing environment in order to facilitate wafer cooling. However, a need still exists for improved techniques for cooling the wafer and reducing spike-anneal peak widths during processing and for maintaining wafer uniformity during processing.

Accordingly, provided is a processing apparatus equipped with a gas showerhead assembly capable of delivering high velocity gas flow to the wafer in order to more rapidly cool the wafer. Furthermore, the gas showerhead includes one or more gas diffusion mechanisms the provide uniform gas delivery across the surface of the workpiece.

Aspects of the present disclosure provide a number of technical effects and benefits. For instance, the processing apparatus provided herein allows for the ability to more rapidly cool the workpiece during processing using high velocity gas flow. Further, the processing apparatus uniformly delivers high velocity gas to preserve workpiece uniformity and integrity. Advantageously, the processing apparatus supports the delivery of high velocity gas in a more uniform manner, which contributes to wafer uniformity during processing.

Variations and modifications can be made to these example embodiments of the present disclosure. As used in the specification, the singular forms "a," "and," and "the" include plural referents unless the context clearly dictates otherwise. The use of "first," "second," "third," etc., are used as identifiers and are not necessarily indicative of any ordering, implied or otherwise. Example aspects may be discussed with reference to a "substrate," "workpiece," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

Example embodiments of a processing apparatus will now be discussed with reference to FIGS. 1-4. As shown in FIG. 1, according to example aspects of the present disclosure, the apparatus 100 can include a gas delivery system 155 configured to deliver process gas to the processing chamber 110, for instance, via a gas showerhead assembly 500. The gas delivery system can include a plurality of feed gas lines 159. The feed gas lines 159 can be controlled using valves 158 and/or gas flow controllers 185 to deliver a desired amount of gases into the processing chamber as process gas. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the processing chamber 110. In embodiments, the gas delivery system 155 can be controlled with gas flow controllers 185.

The gas delivery system 155 can be disposed about a first side of the processing chamber 110, such as the top side of the processing chamber 110. Accordingly, the gas delivery system 155 can provide process gases to the top side of the processing chamber 100. In this manner, process gas delivered by the gas delivery system 155 is first exposed to the top side of the workpiece 114 in the processing chamber 110. The processing apparatus 100 includes a gas showerhead assembly 500. As shown, the gas showerhead assembly 500 is disposed about the first side of the processing chamber 110. The gas showerhead assembly 500 is transparent to electromagnetic radiation, such as radiation emitted by one or more heat sources. For example, the gas showerhead assembly 500 can be formed from quartz material. The gas showerhead assembly 500 can be used to more uniformly disperse process gases in the processing chamber 110 as will be further discussed hereinbelow.

The workpiece 114 to be processed is supported in the processing chamber 110 by the workpiece support 112. Workpiece 114 can be or include any suitable workpiece, such as a semiconductor workpiece, such as a silicon wafer. In some embodiments, workpiece 114 can be or include a doped silicon wafer. For example, a silicon wafer can be doped such that a resistivity of the silicon wafer is greater than about 0.1 Ω·cm, such as greater than about 1 Ω·cm. The workpiece 114 can be disposed on the workpiece such that the workpiece has a top side and a back side, the back side opposite generally facing the workpiece support and the back side is opposite the top side.

Workpiece support 112 can be or include any suitable support structure configured to support workpiece 114 in processing chamber 110. For example, the workpiece support 112 can be a workpiece support 112 operable to support a workpiece 114 during thermal processing (e.g., a workpiece support plate). In some embodiments, workpiece support 112 can be configured to support a plurality of workpieces 114 for simultaneous thermal processing by a thermal processing system. In some embodiments, workpiece support 112 can rotate workpiece 114 before, during, and/or after thermal processing. In some embodiments, workpiece support 112 can be transparent to and/or otherwise configured to allow at least some radiation to at least partially pass through workpiece support 112. For instance, in some embodiments, a material of workpiece support 112 can be selected to allow desired radiation to pass through workpiece support 112, such as radiation that is emitted by workpiece 114 and/or emitters 150. In some embodiments, workpiece support 112 can be or include a quartz material, such as a hydroxyl free quartz material.

Workpiece support 112 can include one or more support pins 115, such as at least three support pins, extending from workpiece support 112. In some embodiments, workpiece support 112 can be spaced from the top of the processing chamber 110. In some embodiments, the support pins 115 and/or the workpiece support 112 can transmit heat from heat sources 140 and/or absorb heat from workpiece 114. In some embodiments, the support pins 115 can be made of quartz.

The processing apparatus can further include a rotation shaft 900 passing through dielectric window 108 that is configured to support the workpiece support 112 in the processing chamber 110. For example, the rotation shaft 900 is coupled on one end to the workpiece support 112 and is coupled about the other end to a rotation device (not shown in figures) capable of rotating the rotation shaft 900 360°. For instance, during processing of the workpiece 114 (e.g., thermal processing) the workpiece 114 can be continually rotated such that heat generated by the one or more heat sources 140 can evenly heat the workpiece 114. In some embodiments, rotation of the workpiece 114 forms radial heating zones on the workpiece 114, which can help to provide a good temperature uniformity control during the heating cycle.

In certain embodiments, it will be appreciated that a portion of the rotation shaft 900 is disposed in the processing chamber 110 while another portion of the rotation shaft 900 is disposed outside the processing chamber 110 in a manner such that a vacuum pressure can be maintained in the processing chamber 110. For example, during processing of the workpiece 114 a vacuum pressure may need to be maintained in the processing chamber 110 while the workpiece 114 is rotated during processing. Accordingly, the rotation shaft 900 is positioned through the dielectric window 108 and in the processing chamber 110, such that the rotation shaft 900 can facilitate rotation of the workpiece 114 while a vacuum pressure is maintained in the processing chamber 110.

In other embodiments, the rotation shaft 900 can be coupled to a translation device that is capable of moving the rotation shaft 900 and the workpiece support 112 up and down in a vertical manner (not shown in figures). For example, when loading or unloading workpiece 114 from the processing chamber 110, it may be desirable to raise the workpiece 114 via the workpiece support 112 so that removal devices can be used to easily access the workpiece 114 and remove it from the processing chamber 110. Example removal devices may include robotic susceptors. In other embodiments, the workpiece support 112 may need to be vertically moved in order to provide routine maintenance on the processing chamber 110 and elements associated with the processing chamber 110. Suitable translations devices that may be coupled to the rotation shaft 900 include bellows or other mechanical or electrical devices capable of translating the rotation shaft 900 in a vertical motion.

Processing apparatus 100 can include one or more heat sources 140. In some embodiments, heat sources 140 can include one or more heating lamps 141. For example, heat sources 140 including one or more heating lamps 141 can emit thermal radiation to heat workpiece 114. In some embodiments, for example, heat sources 140 can be broadband radiation sources including arc lamps, incandescent lamps, halogen lamps, any other suitable heating lamp, or combinations thereof. In some embodiments, heat sources 140 can be monochromatic radiation sources including light-emitting iodides, laser iodides, any other suitable heating lamps, or combinations thereof. The heat source 140 can include an assembly of heating lamps 141, which are positioned, for instance, to heat different zones of the workpiece 114. The energy supplied to each heating zone can be controlled while the workpiece 114 is heated. Further, the amount and/or type of radiation applied to various zones of the workpiece 114 can also be controlled in an open-loop fashion. In this configuration, the ratios between the various heating zones can be pre-determined after manual optimization. In other embodiments, the amount and/or type of radiation applied to various zones of the workpiece 114 can be controlled in a closed-loop fashion, based on temperature of the workpiece 114.

Figure 2:
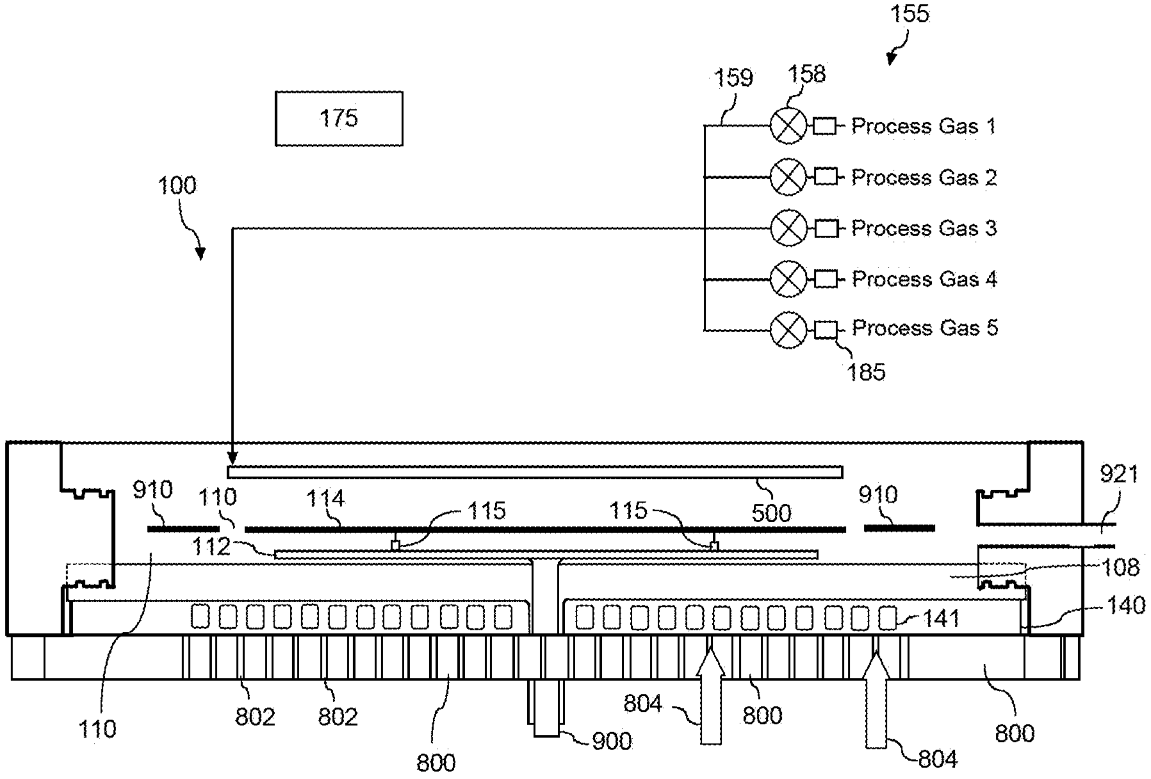
FIG. 2 depicts an example processing system according to example aspects of the present disclosure.
Figure 4:
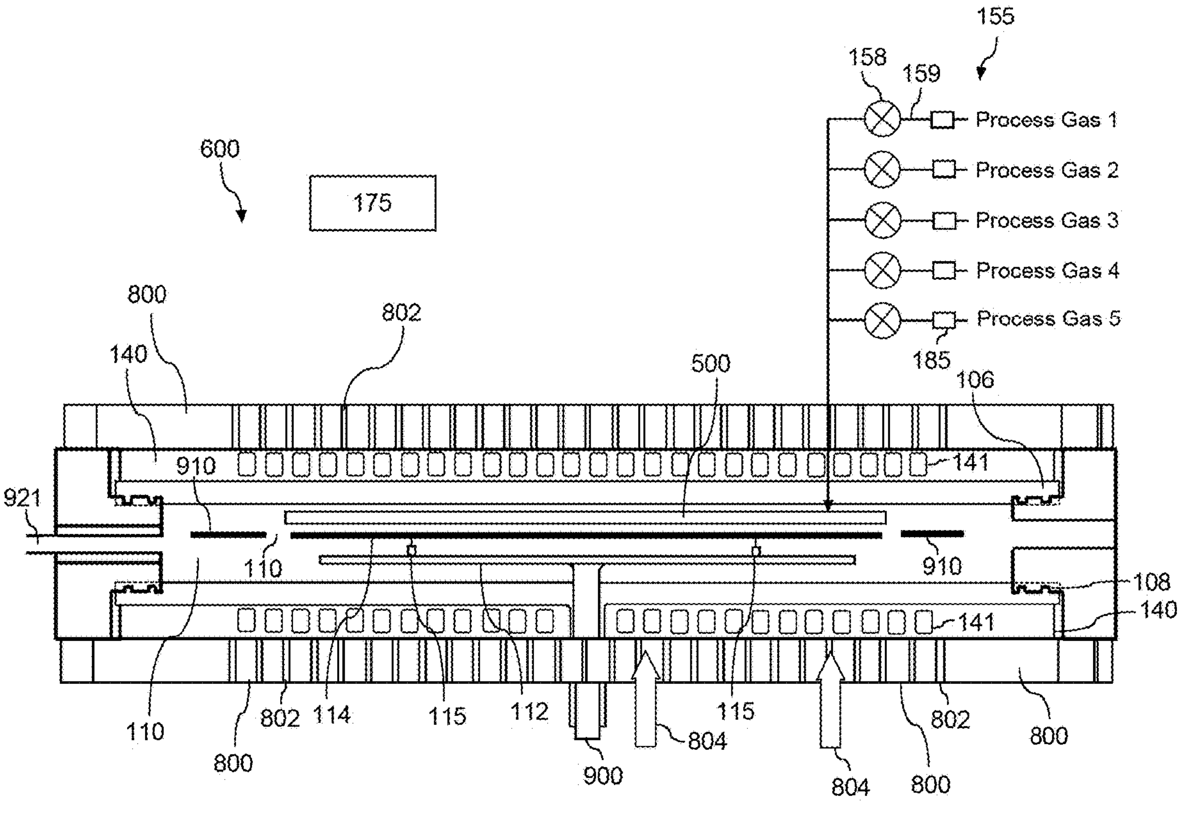
FIG. 4 depicts an example processing system according to example aspects of the present disclosure.

In some embodiments, directive elements such as, for example, reflectors 800 (e.g., mirrors) can be configured to direct radiation from heat sources 140 into processing chamber 110. In certain embodiments, reflectors 800 can be configured to direct radiation from one or more heating lamps 141 towards workpiece 114 and/or workpiece support 112. For example, one or more reflectors 800 can be disposed with respect to the heat sources 140 as shown in FIGS. 2 and 4. One or more cooling channels 802 can be disposed between or within the reflectors 800. As shown by arrows 804 in FIGS. 2 and 4, ambient air can pass through the one or more cooling channels 802 to cool the one or more heat sources 140, such as the heat lamps 141.

Figure 3:
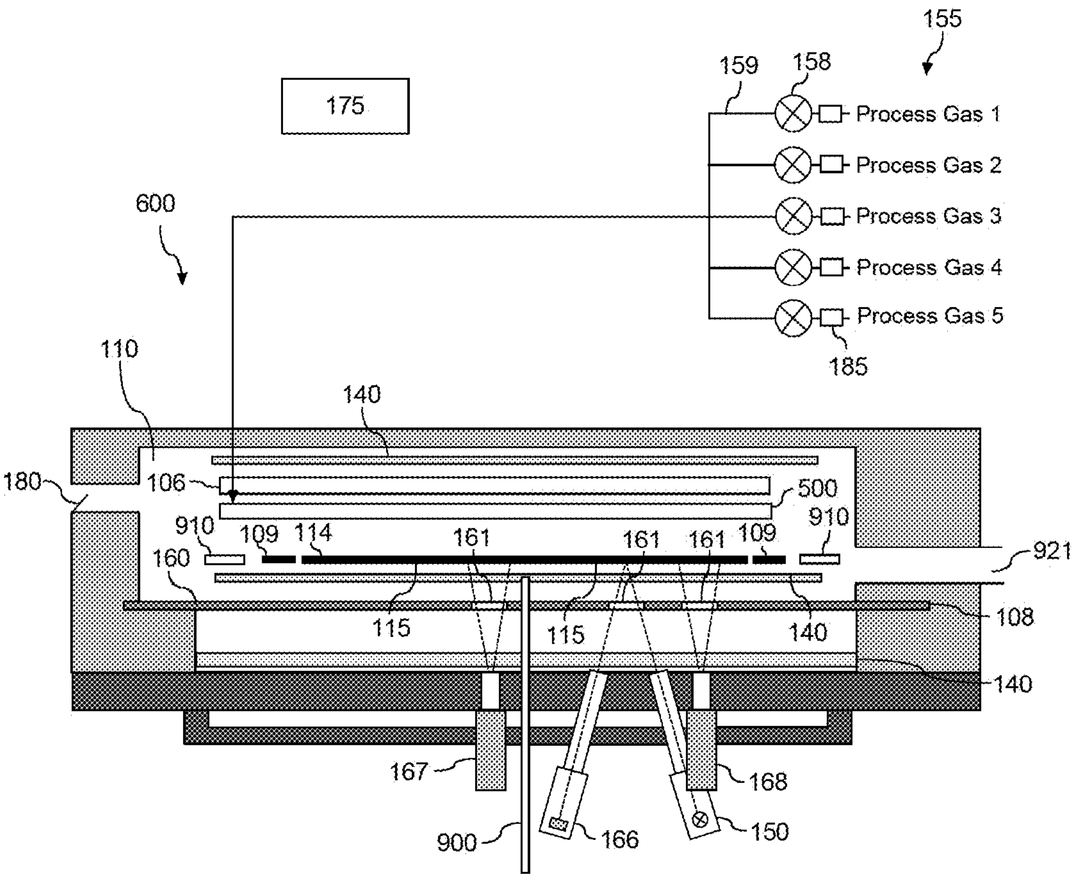
FIG. 3 depicts an example processing system according to example aspects of the present disclosure.

Referring now to FIGS. 3-4, a first group of one or more heat sources 140 can be disposed on the bottom side of the processing chamber 110 and a second group of one or more heat sources 140 can be disposed on the top side of the processing chamber 110. For instance, the heat sources 140 disposed on the bottom side of the processing chamber 110 can be used to heat a back side of the workpiece 114 when it is atop the workpiece support 112. The heat sources 140 disposed on the top side of the processing chamber 110 can be used to heat a top side of the workpiece 114 when it is atop the workpiece support 112. In such embodiments, the gas showerhead assembly 500 is disposed between the second group of one or more heat sources 140 disposed on the top side of the processing chamber 110 and the workpiece 114.

According to example aspects of the present disclosure, one or more dielectric windows 106,108 can be disposed between the heat source 140 and the workpiece support 112. According to example aspects of the present disclosure, windows 106,108 can be disposed between workpiece 114 and heat sources 140. Windows 106,108 can be configured to selectively block at least a portion of radiation emitted by heat sources 140 from entering a portion of the processing chamber 110. For example, windows 106,108 can include opaque regions 160 and/or transparent regions 161. As used herein, "opaque" means generally having a transmittance of less than about 0.4 (40%) for a given wavelength, and "transparent" means generally having a transmittance of greater than about 0.4 (40%) for a given wavelength.

Opaque regions 160 and/or transparent regions 161 can be positioned such that the opaque regions 160 block stray radiation at some wavelengths from the heat sources 140, and the transparent regions 161 allow, for example, emitters 150, heat sources 140, reflectance sensor 166, and/or temperature measurement devices 167,168 to have no obstruction to radiation in processing chamber 110 at the wavelengths blocked by opaque regions 160. In this way, the windows 106,108 can effectively shield the processing chamber 110 from radiation contamination by heat sources 140 at given wavelengths while still allowing radiation from the heat sources 140 to heat workpiece 114. Opaque regions 160 and transparent regions 161 can generally be defined as opaque and transparent, respectively, to a particular wavelength; that is, for at least radiation at the particular wavelength, the opaque regions 160 are opaque and the transparent regions 161 are transparent.

Windows 106,108, including opaque regions 160 and/or transparent regions 161, can be formed of any suitable material and/or construction. In some embodiments, dielectric windows 106,108 can be or include a quartz material. Furthermore, in some embodiments, opaque regions 160 can be or include hydroxyl (OH) containing quartz, such as hydroxyl (OH—) doped quartz, and transparent regions 161 can be or include hydroxyl free quartz. Hydroxyl doped quartz can exhibit desirable wavelength blocking properties in accordance with the present disclosure. For instance, hydroxyl doped quartz can block radiation having a wavelength of about 2.7 micrometers, which can correspond to a temperature measurement wavelength at which some sensors (e.g., reflectance sensor 166 and temperature measurement devices 167, 168) in the processing apparatus 100 operate, while hydroxyl free quartz can be transparent to radiation with a wavelength of about 2.7 micrometers. Thus, the hydroxyl doped quartz regions can shield the sensors (e.g., reflectance sensor 166 and temperature measurement devices 167, 168) from stray radiation of the wavelength in the processing chamber 110 (e.g., from heat sources 140), and the hydroxyl free quartz regions can be disposed at least partially within a field of view of the sensors to allow the sensors to obtain measurements at the wavelength within the thermal processing system.

One or more exhaust ports 921 can be disposed in the processing chamber 110 that are configured to pump gas out of the processing chamber 110, such that a vacuum pressure can be maintained in the processing chamber 110. The process gas is exposed to the workpiece 114 and then flows around either side of the workpiece 114 and is evacuated from the processing chamber 110 via one or more exhaust ports 921. One or more pumping plates 910 can be disposed around the outer perimeter of the workpiece 114 to facilitate process gas flow, which will be discussed more particularly with respect to the following figures below. Isolation door 180, when open, allows entry of the workpiece 114 to the processing chamber 110 and, when closed, allows the processing chamber 110 to be sealed, such that a vacuum pressure can be maintained in the processing chamber 110 such that thermal processing can be performed on workpiece 114.

In embodiments, the apparatus 100 can include a controller 175. The controller 175 controls various components in processing chamber 110 to direct processing of workpiece 114. For example, controller 175 can be used to control heat sources 140. Additionally and/or alternatively, controller 175 can be used to control the heat sources 140 and/or a workpiece temperature measurement system, including, for instance, emitter 150, reflectance sensor 166, and/or temperature measurement devices 167,168. The controller 175 can also implement one or more process parameters, such as controlling the gas flow controllers 185 and altering conditions of the processing chamber 110 in order to maintain a vacuum pressure in the processing chamber during processing of the workpiece 114. The controller 175 can include, for instance, one or more processors and one or more memory devices. The one or more memory devices can store computer-readable instructions that, when executed by the one or more processors, cause the one or more processors to perform operations, such as any of the control operations described herein.

In particular, FIGS. 1 and 3 depict certain components useful in the workpiece temperature measurement system, including one or more temperature measurement devices 167,168. In embodiments, temperature measurement device 167 is located in a more centered location with respect to temperature measurement device 168. For example, temperature measurement device 167 can be disposed on or next to a centerline of the workpiece support 112, such that when a workpiece 114 is disposed on the workpiece support 112, temperature measurement device 167 can obtain a temperature measurement corresponding to the center of the workpiece 114. Temperature measurement device 168 can be disposed in an outer location from the centerline of the workpiece support 112, such that temperature measurement device 168 can measure the temperature of the workpiece 114 along an outer perimeter of the workpiece 114. Accordingly, the temperature measurement system includes one or more temperature measurement devices capable of measuring the temperature of the workpiece 114 at different locations on the workpiece 114. Temperature measurement devices 167,168 can include pyrometers. Temperature measurement devices 167,168 can also include one or more sensors capable of sensing radiation emitted from the workpiece 114 and/or capable of sensing a reflected portion of radiation that is emitted by an emitter and reflected by the workpiece, which will be discussed in more detail hereinbelow.

For instance, in some embodiments, temperature measurement devices 167, 168 can be configured to measure radiation emitted by workpiece 114 at a temperature measurement wavelength range. For example, in some embodiments, temperature measurement devices 167, 168 can be a pyrometer configured to measure radiation emitted by the workpiece at a wavelength within the temperature measurement wavelength range. The wavelength can be or include a wavelength that transparent regions 161 are transparent to and/or opaque regions 160 are opaque to, for example at 2.7 micrometers, in embodiments where the opaque regions 160 include hydroxyl doped quartz. The wavelength can additionally correspond to a wavelength of blackbody radiation emitted by workpiece 114. The temperature measurement wavelength range can include 2.7 micrometers accordingly.

In some embodiments, the temperature measurement system includes one or more emitters 150 and one or more reflectance sensors 166. For example, in embodiments the workpiece temperature measurement system can also include an emitter 150 configured to emit radiation directed at an oblique angle to workpiece 114. In embodiments, emitter 150 can be configured to emit infrared radiation. The radiation emitted by emitter 150 may also be referred to herein as calibration radiation. Radiation emitted by emitter 150 can be reflected by workpiece 114 forming a reflected portion of radiation that is collected by reflectance sensor 166. The reflectance of workpiece 114 can be represented by the intensity of the reflected portion of radiation incident on reflectance sensor 166. For an opaque workpiece 114, the emissivity of workpiece 114 can then be calculated from reflectance of workpiece 114. At the same time, radiation emitted by the workpiece 114 can be measured by sensors in temperature measurement devices 167 and 168. In some embodiments, such radiation emitted by workpiece 114 and measured by sensors in temperature measurement devices 167 and 168 does not constitute the reflected portion of the calibration radiation that was emitted by emitter 150 and reflected by workpiece 114. Finally, the temperature of the workpiece 114 can be calculated based on radiation emitted by workpiece 114 in combination with the emissivity of workpiece 114.

Radiation emitted by an emitter (e.g., emitter 150) and/or measured by a sensor (e.g., reflectance sensor 166 and/or sensors in temperature measurement devices 167,168) can have one or more associated wavelengths. For instance, in some embodiments, an emitter can be or include a narrow-band emitter that emits radiation such that a wavelength range of the emitted radiation is within a tolerance of a numerical value, such as within 10% of the numerical value, in which case the emitter is referred to by the numerical value. In some embodiments, this can be accomplished by a combination of a broadband emitter that emits a broadband spectrum (e.g., a Planck spectrum) and an optical filter, such as an optical notch filter, configured to pass only a narrow band within the broadband spectrum. Similarly, a sensor can be configured to measure an intensity of narrow-band radiation at (e.g., within a tolerance of) a wavelength of a numerical value. For example, in some embodiments, a sensor, such as a pyrometer, can include one or more heads configured to measure (e.g., select for measurement) a particular narrow-band wavelength.

According to example aspects of the present disclosure, one or more transparent regions 161 can be disposed at least partially in a field of view of emitter 150 and/or reflectance sensor 166. For instance, emitter 150 and reflectance sensor 166 can operate at the temperature measurement wavelength range at which the transparent regions 161 are transparent. For example, in some embodiments, emitter 150 and/or reflectance sensor 166 can operate at 2.7 micrometers. As illustrated in FIGS. 1 and 3, the transparent regions 161 can be positioned such that a radiation flow (indicated generally by dashed lines) starts from emitter 150, passes through transparent regions 161, is reflected by the workpiece 114, and is collected by reflectance sensor 166, without obstruction by window 108 (e.g., opaque regions 160). Similarly, opaque regions 160 can be disposed in regions on window 108 that are outside of the emitted and reflected radiation flow to shield workpiece 114 and especially reflectance sensor 166 from radiation in the temperature measurement wavelength range from heat sources 140. For example, in some embodiments, transparent regions 161 can be included for sensors and/or emitters operating at 2.7 micrometer wavelengths.

In some embodiments, emitter 150 and/or reflectance sensor 166 can be phase-locked. For instance, in some embodiments, emitter 150 and/or reflectance sensor 166 can be operated according to a phase-locked regime. For instance, although opaque regions 160 can be configured to block most stray radiation from heat sources 140 at a first wavelength, in some cases stray radiation can nonetheless be perceived by reflectance sensor 166, as discussed above. Operating the emitter 150 and/or reflectance sensor 166 according to a phase-locked regime can contribute to improved accuracy in intensity measurements despite the presence of stray radiation.

Figure 5:
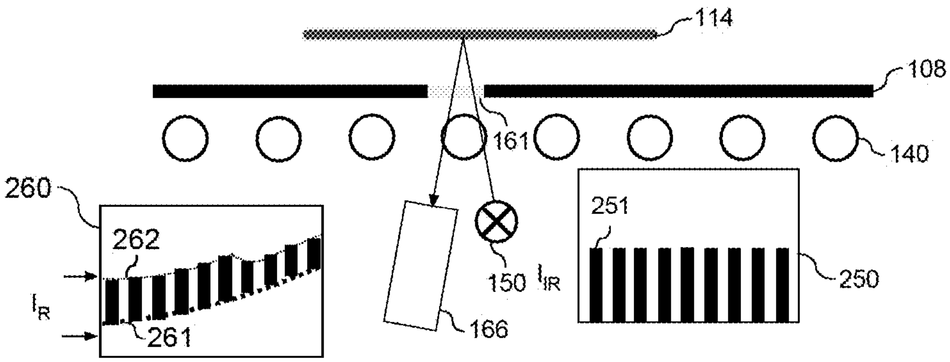
FIG. 5 depicts an example temperature measurement system according to example embodiments of the present disclosure.

As shown in FIG. 5, an example phase locking regime is discussed with respect to plots 250, 260. Plot 250 depicts radiation intensity for radiation $I_{IR}$ emitted within the temperature measurement wavelength range by emitter 150 over time (e.g., over a duration of treatment processes performed on workpiece 114). As illustrated in plot 250, radiation intensity emitted by emitter 150 can be modulated. For example, the emitter 150 can emit the calibration radiation onto the workpiece 114 with a modulation in intensity. For instance, the radiation intensity emitted by emitter 150 can be modulated as pulses 251. In some embodiments, radiation can be emitted by emitter 150 in a pulsing mode. In some other embodiments, a constant radiation of emitter 150 can be blocked periodically by a rotating chopper wheel (not shown in the figure). A chopper wheel can include one or more blocking portions and/or one or more passing portions. A chopper wheel can be revolved in a field of view of emitter 150 such that a constant stream of radiation from emitter 150 is intermittently interrupted by blocking portions and passed by passing portions of the chopper wheel. Thus, a constant stream of radiation emitted by emitter 150 can be modulated into pulses 251 with a pulsing frequency corresponding to the chopper wheel rotation. The pulsing frequency can be selected to be or include a frequency having little to no overlap to operation of other components in the processing apparatus 100. For example, in some embodiments, the pulsing frequency can be about 130 Hz. In some embodiments, a pulsing frequency of 130 Hz can be particularly advantageous as heat sources 140 can be configured to emit substantially no radiation having a frequency of 130 Hz. Additionally and/or alternatively, reflectance sensor 166 can be phase-locked based on the pulsing frequency. For instance, the processing apparatus 100 (e.g., controller 175) can isolate a measurement (e.g., a reflectivity measurement of workpiece 114) from reflectance sensor 166 based on calibration radiation of emitter 150 modulated at the pulsing frequency and reflected from the workpiece 114. In this way, processing apparatus 100 can reduce interference from stray radiation in measurements from reflectance sensor 166. In embodiments, at least one reflectance measurement can be isolated from one or more sensors based, at least in part, on the pulsing frequency.

Similarly, plot 260 depicts reflected radiation intensity IR measured by reflectance sensor 166 over time. Plot 260 illustrates that, over time (e.g., as workpiece 114 increases in temperature), stray radiation in the chamber (illustrated by stray radiation curves 261) can increase. This can be attributable to, for example, an increasing emissivity of workpiece 114 and correspondingly a decreasing reflectivity of workpiece 114 with respect to an increased temperature of workpiece 114, an increased intensity of heat source 140, and/or various other factors related to processing of workpiece 114.

During a point in time at which emitter 150 is not emitting radiation, reflectance sensor 166 can obtain measurements corresponding to the stray radiation curves 261 (e.g., stray radiation measurements). Similarly, during a point in time at which emitter 150 is emitting radiation (e.g., pulse 251), reflectance sensor 166 can obtain measurements corresponding to total radiation curves 262 (e.g., total radiation measurements). The reflectance measurements can then be corrected based on this information indicative of stray radiation curves 261.

While example embodiments disclose that reflectance sensor 166 is used to collect reflected radiation that is emitted by emitter 150, the disclosure is not so limited. In certain embodiments, one or more heating lamps 141 may be used to emit radiation similar to that of emitter 150 as described herein. For example, radiation emitted by the one or more heating lamps 141 can include a first radiation component and a second radiation component. The first radiation component emitted is configured to heat workpiece 114, while the second radiation component emitted is modulated at a pulsing frequency. Portions of the modulated second radiation component emitted by the one or more heat lamps 141 can be reflected by the workpiece 114 and collected on the reflectance sensor 166, such that a reflectivity measurement of workpiece 114 can be obtained.

In other certain embodiments, temperature measurement devices 167,168 can also be configured with sensors capable of functioning in a similar manner to reflectance sensor 166. Namely, temperature measurement devices 167,168 can also collect reflected portions of a modulated radiation, such as calibration radiation, that can be used to determine a reflectivity measurement of workpiece 114. In some embodiments, the processing apparatus (e.g., controller 175) can isolate from reflectance sensor 166 and/or temperature measurement devices 167,168, a first radiation measurement of workpiece 114 and a second reflectivity radiation measurement of workpiece 114. The second reflectivity radiation measurement of workpiece 114 is based on a reflected portion of radiation emitted by emitter 150 or one or more heat lamps 141 modulated at the pulsing frequency.

In certain embodiments, a workpiece temperature control system can be used to control power supply to the heat sources 140 in order to adjust the temperature of the workpiece 114. For example, in certain embodiments the workpiece temperature control system can be part of the controller 175. In embodiments, the workpiece temperature control system can be configured to change the power supply to the heat source 140 independent to the temperature measurement obtained by the temperature measurement system. However, in other embodiments, the workpiece temperature control system can be configured to change the power supply to the heat sources 140 based, at least in part, on the one or more temperature measurements of workpiece 114. A closed loop feedback control can be applied to adjust the power supply to the heat sources 140 such that energy from the heat sources 140 applied to the workpiece 114 will heat the workpiece to but not above a desired temperature. Thus, the temperature of the workpiece 114 may be maintained by closed loop feedback control of the heat source 140, such as by controlling the power to the heat source 140. For example, the one or more radiative heat sources 140 can be operated in a closed-loop fashion to control a temperature of the workpiece 114 with data from the workpiece temperature measurement system.

As described, the heat sources 140 are capable of emitting radiation at a heating wavelength range and the temperature measurement system is capable of obtaining a temperature measurement about a temperature measurement wavelength range. Accordingly, in certain embodiments the heating wavelength range is different from the temperature measurement wavelength range.

Figure 6:
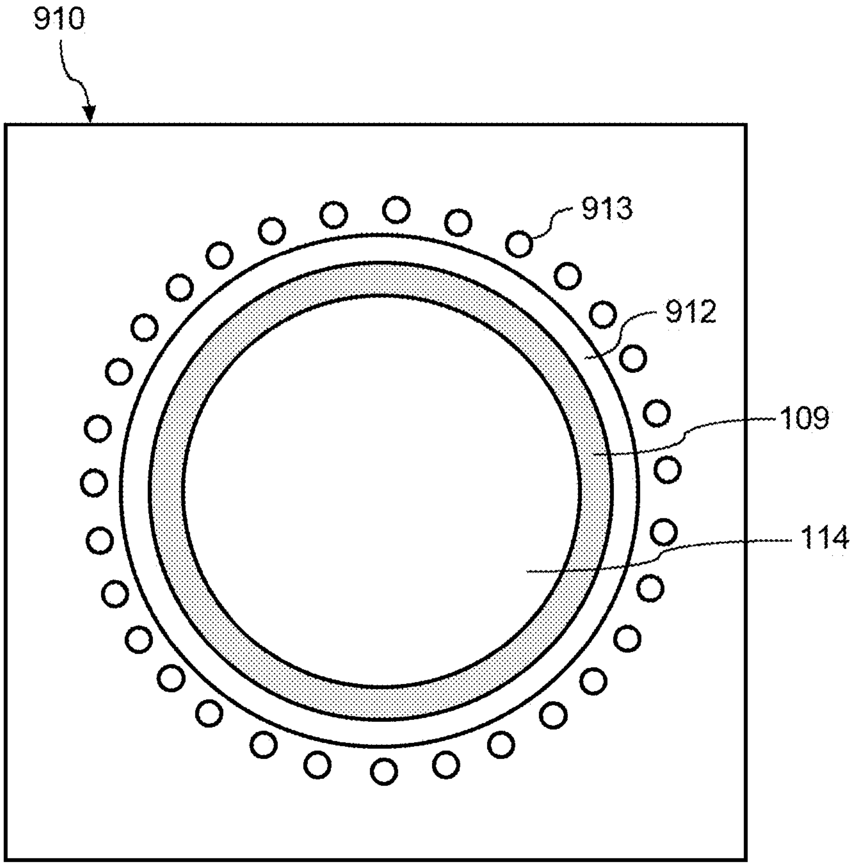
FIG. 6 depicts an example pumping plate according to example aspects of the present disclosure.
Figure 7:
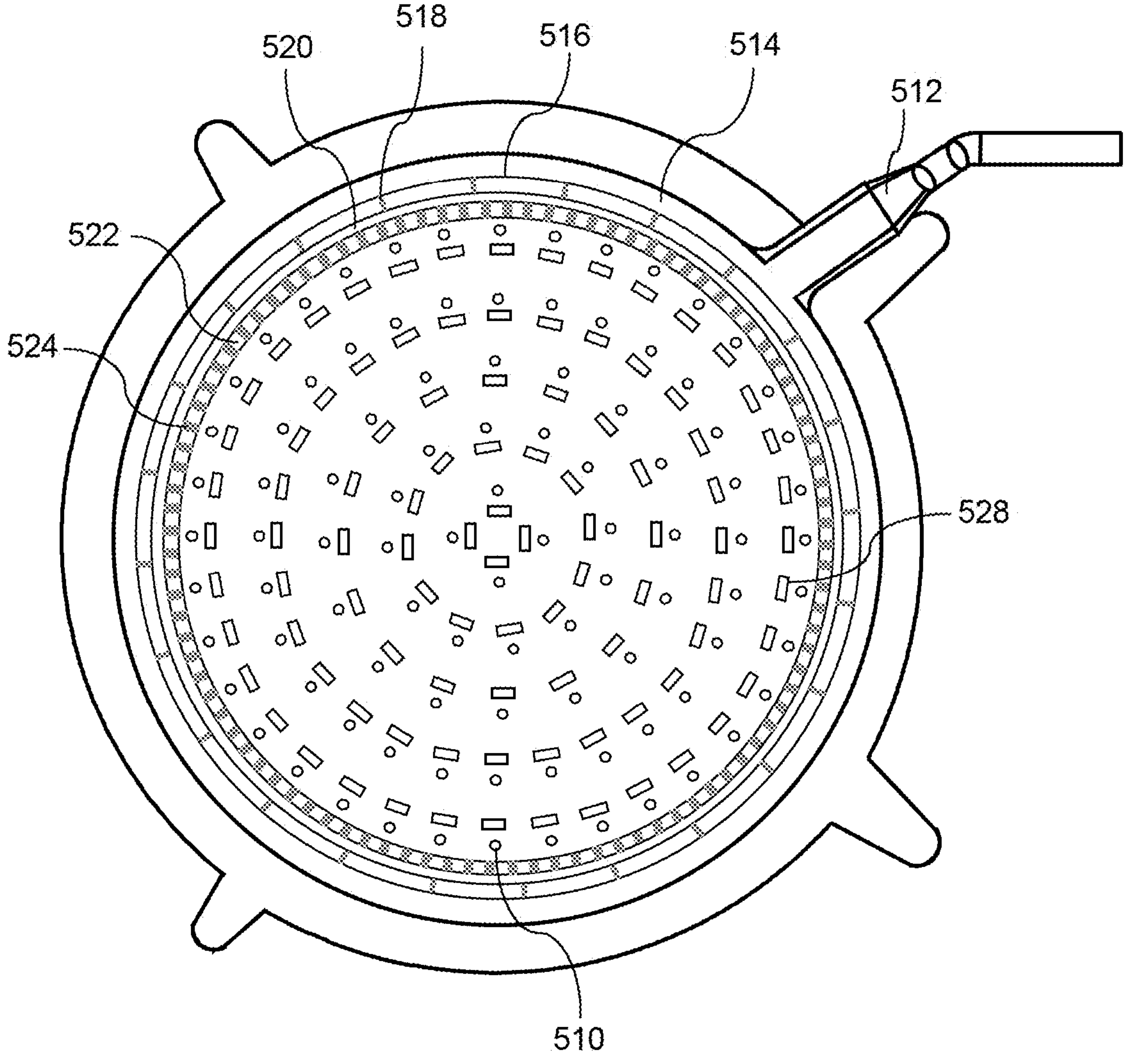
FIG. 7 depicts a portion of an example gas showerhead assembly according to example aspects of the present disclosure.

A guard ring 109 can be used to lessen edge effects of radiation from one or more edges of the workpiece 114. The guard ring 109 can be disposed around the workpiece 114. Further, in embodiments, the processing apparatus includes a pumping plate 910 disposed around the workpiece 114 and/or the guard ring 109. For example, FIG. 6 illustrate an example pumping plate 910 that can be used in embodiments provided. The pumping plate 910 includes one or more pumping channels 912, 913 for facilitating the flow of gas through the processing chamber 110. For example, the pumping plate 910 can include a continuous pumping channel 912 configured around the workpiece 114. The continuous pumping channel 912 can include an annular opening configured to allow gas to pass from a first side, such as a top side, of the workpiece 114 to a second side, such at the back side, of the workpiece 114. The continuous pumping channel 912 can be disposed concentrically around the guard ring 109. Additional pumping channels 913 can be disposed in the pumping plate 910 to facilitate gas movement within the processing chamber 110. The pumping plate 910 can be or include a quartz material. Furthermore, in some embodiments, pumping plate 910 can be or include quartz containing a significant level of hydroxyl (OH) groups, a.k.a. hydroxyl doped quartz. Hydroxyl doped quartz can exhibit desirable wavelength blocking properties in accordance with the present disclosure.

Example embodiments of a gas showerhead assembly 500 will now be discussed with reference to FIGS. 7-10. The gas showerhead assembly 500 includes an enclosure 502 having a top cover 504 and a bottom 506. In embodiments, the enclosure 502 has an enclosure diameter that is larger than a workpiece diameter. The bottom 506 of the gas showerhead assembly 500 includes a plurality of gas injection apertures 510 for delivering one or more process gases to the top side of the workpiece 114. The gas shower head assembly 500 includes one or more gas diffusion mechanisms capable of distributing gas within the enclosure 502. A gas injection port 512 is configured to deliver process gases into the enclosure 502. In embodiments, the gas injection port 512 delivers process gases into a first radial gas distribution channel 514. The first radial gas distribution channel 514 extends radially around the perimeter of the gas showerhead assembly 500. The first radial gas distribution channel 514 allows for high velocity process gas to evenly distribute radially around the gas showerhead assembly 500.

A first radial gas injection barrier 516 is disposed radially inward form the first radial gas distribution channel 514. The first radial gas injection barrier 516 includes one or more gas diffusion apertures 518 situated therein. Gas flowing radially around the first radial gas distribution channel 514 can diffuse or flow through the one or more gas diffusion apertures 518 in the first radial gas injection barrier 516 and enter a second radial gas distribution channel 520 situated radially inward from the first radial gas injection barrier 516. The configuration of the first and second radial gas distribution channels 514,520 allows for a pressure gradient between the two radial gas distribution channel 514,520. For example, the first radial gas distribution channel 514 can have a higher pressure as compared to the second radial gas distribution channel 520.

A second radial gas injection barrier 522 is disposed radially inward from the second radial gas distribution channel 520. Gas flowing around the second radial gas distribution channel 520 can diffuse or flow through one or more gas diffusion apertures 524 disposed in the second radial gas injection barrier 522. In certain embodiments, the second radial gas injection barrier 522 includes a greater number of gas diffusion apertures 524 as compared to the first radial gas injection barrier 516. For example, the ratio of gas diffusion apertures 524 to gas diffusion apertures 518 can be at least about 2:1, such as 3:1, such as 4:1, such as 5:1. In other words, the first radial gas injection barrier 516 can include at least twice as many, such as at least three times as many, such as at least four times as many, such as at least five times as many, gas diffusion apertures 518 as compared to the second radial gas injection barrier 522.

Figure 8:
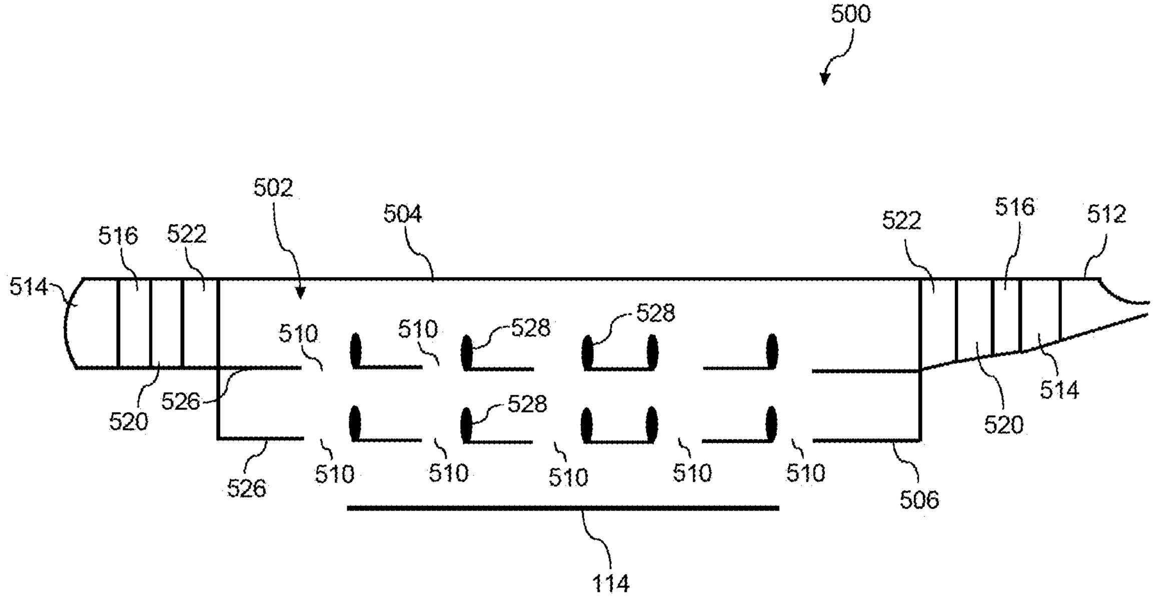
FIG. 8 depicts a portion of an example gas showerhead assembly according to example aspects of the present disclosure.
Figure 9:
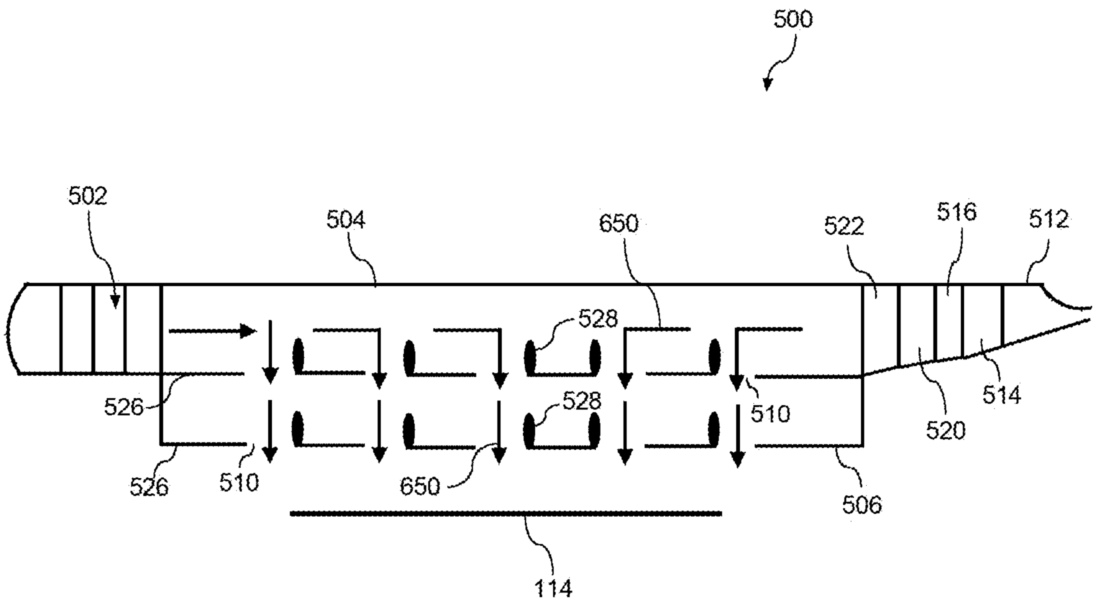
FIG. 9 depicts a portion of an example gas showerhead assembly according to example aspects of the present disclosure.
Figure 10:
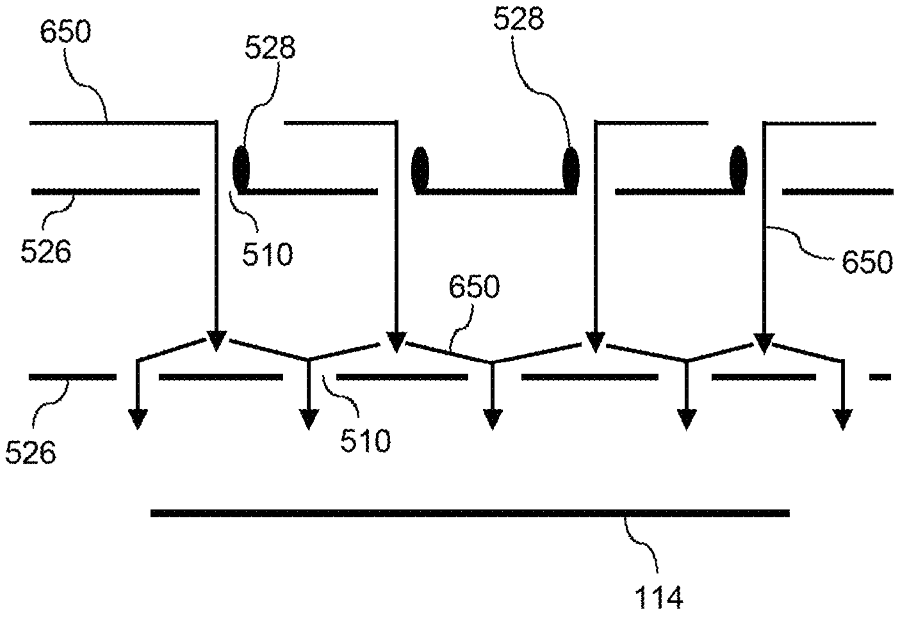
FIG. 10 depicts a portion of an example gas showerhead assembly according to example aspects of the present disclosure.

Referring to FIGS. 8-10, the gas showerhead assembly 500 can include one or more gas distribution plates 526. For example, as shown, a first gas distribution plate 526 can form the bottom 506 of the enclosure 502. The gas distribution plates 526 are configured to disperse process gas more uniformly in a vertical direction. The gas distribution plates 526 can include one or more gas diffusion apertures 510. In certain embodiments, one or more gas diffusion barriers 528 are disposed radially inward from the one or more gas diffusion apertures 510. Generally, during operation, process gas flows across one or more gas distribution plates 526 in a horizontal direction. The gas diffusion barriers 528 are disposed to be generally perpendicular to the horizontal axis of the gas distribution plates 526 and horizontal flow of process gases. Such a configuration, allows for flowing process gas to contact the surface of the gas diffusion barrier 528, which changes the flow of process gas from a horizontal direction to a more vertical direction as indicated by gas flow arrows 650. Accordingly, the gas diffusion barriers 528 facilitate vertical delivery of the process gases to the workpiece 114. In certain embodiments the one or more gas distribution plates 526 include a first gas distribution plate 526 and a second gas distribution plate 526 disposed in a stacked arrangement. In certain embodiments, the gas diffusion apertures 510 located on the first gas distribution plate 526 and the gas diffusion apertures 510 located on the second gas distribution plate 526 are in vertical alignment (as shown in FIGS. 8-9). In other embodiments, however, it is contemplated that the gas diffusion apertures 510 located on the first gas distribution plate 526 are not vertically aligned with the gas distribution apertures 510 on the second gas distribution plate 526 (as shown in FIG. 10). Accordingly, gas flowing through the gas diffusion apertures 510 of the first gas distribution plate 526 contacts the top surface of the second gas distribution plate 526 where it is then is routed to flow through gas diffusion apertures 510 of the second gas distribution plate 526 as shown by gas flow arrows 650.

While embodiments shown include at least two gas distribution plates 526, the disclosure is not so limited. Indeed, the enclosure could include a single gas distribution plate or a plurality of gas distribution plates, such as at least three gas distribution plates, such as at least four gas distribution plates, and so on. In certain embodiments, the gas showerhead assembly includes a third gas distribution plate disposed in a stacked arrangement between the first gas distribution plate 526 and the second gas distribution plate 526. Furthermore, the gas distribution plates 526 can be stacked in any manner for desired process gas flow. For example, the gas diffusion apertures 510 of the gas distribution plates 526 can be in vertical alignment or can be stacked such that certain gas diffusion apertures 510 are in vertical alignment with neighboring gas distribution plates 526, while other gas diffusion apertures 510 are not in alignment with other gas diffusion apertures 510 on neighboring gas distribution plates 526.

Figure 11:
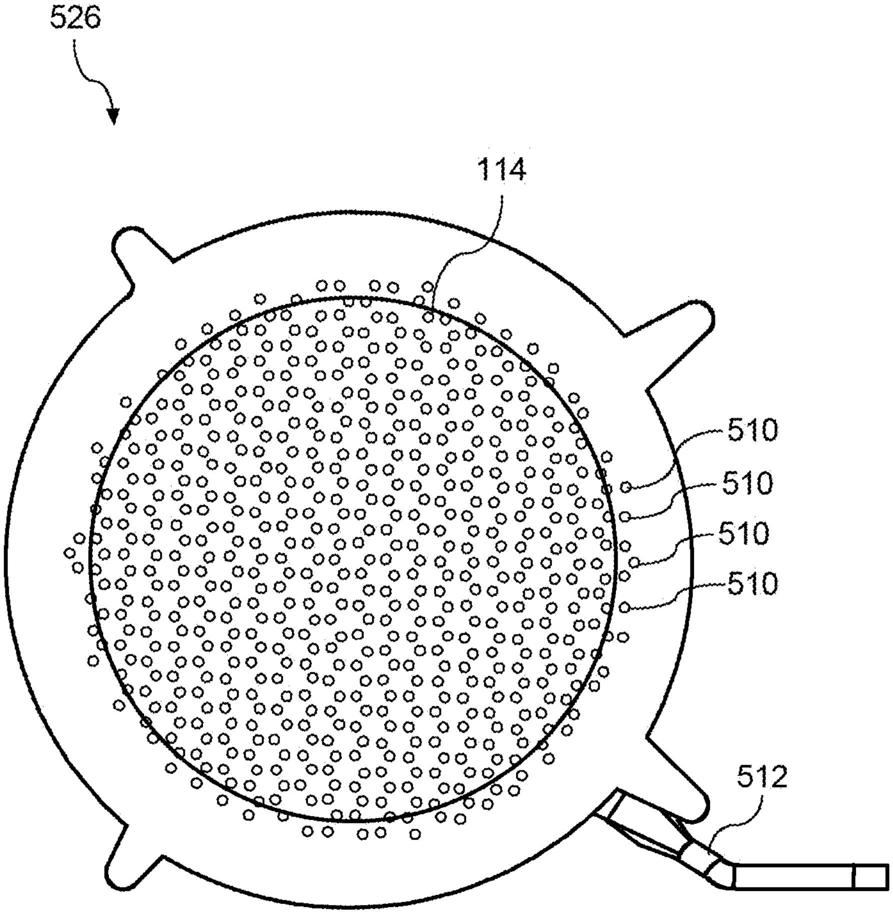
FIG. 11 depicts a portion of an example gas distribution plate according to example aspect of the present disclosure.
Figure 12:
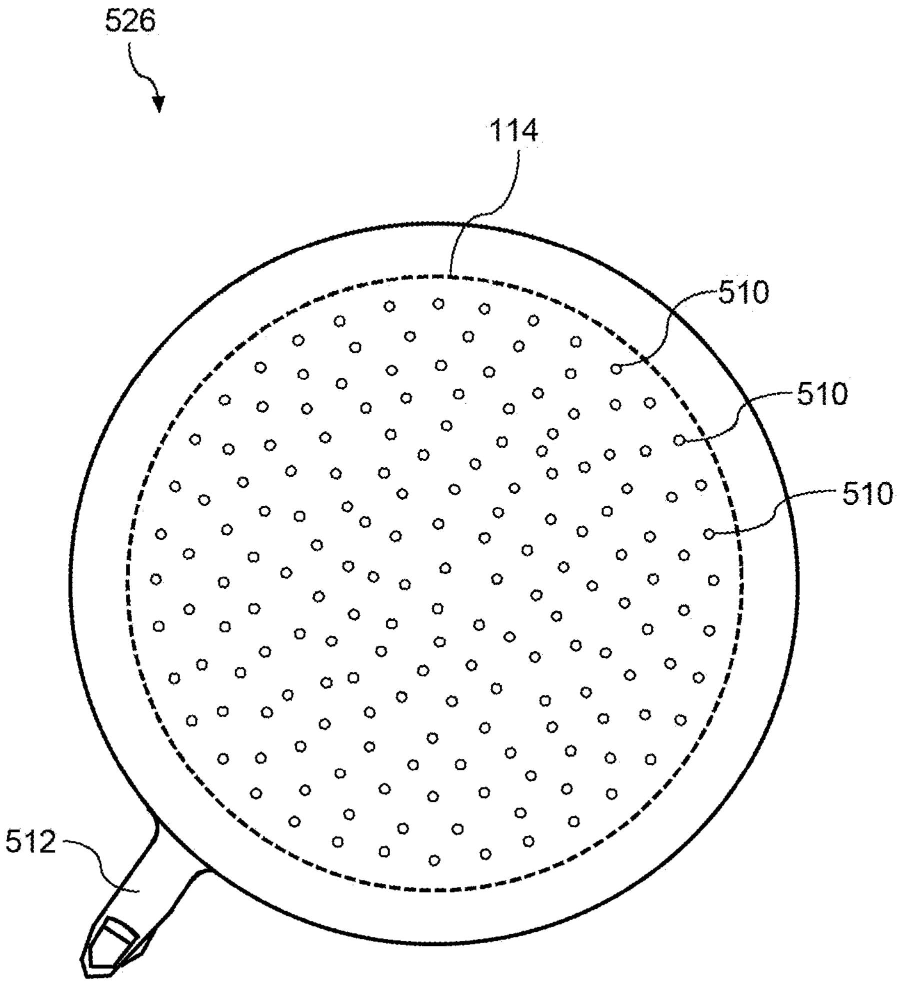
FIG. 12 depicts a portion of an example gas distribution plate according to example aspect of the present disclosure.

In certain embodiments, the gas diffusion apertures 510 can be arranged in any desired patter on the gas distribution plates 526. Indeed, where multiple gas distribution plates 526 are utilized, each gas distribution plate 526 can have the same pattern of gas diffusion apertures 510 or each gas distribution plate can include different gas diffusion aperture 510 patterns. For example, as shown in FIG. 11, the gas distribution plate 526 can include gas diffusion apertures 510 in a hexagonal pattern. Gas diffusion apertures can be arranged in any suitable pattern including rectangular, ovular, circular, diagonal, pentagonal, hexagonal, septagonal, octagonal, etc. The gas distribution plate 526 can include gas diffusion apertures 510 randomly arranged on the gas distribution plate 526 (as shown in FIG. 12). In embodiments, a gas distribution plate 526 having the gas diffusion apertures 510 arranged in a hexagonal pattern can comprise the bottom 506 of the gas showerhead assembly 500 such that process gas disposed on the top surface of the workpiece is distribution by the hexagonally arranged gas diffusion apertures 510.

In certain embodiments, the gas showerhead assembly 500 can be used to distribute a high velocity process gas within the processing chamber 110. For example, certain workpiece processing methods such as chemical vapor deposition processes typically flow process gas at a rate of between 1 slm to 10 slm. However, the gas showerhead assembly 500 allows for the uniform delivery of process gases having a flow rate of 100 slm to about 1,000 slm. The gas showerhead assembly 500 including the gas diffusion mechanisms disclosed herein, allow for high flow rate process gas to be evenly, and uniformly delivered across the surface of the workpiece 114.

FIG. 12 depicts a flow diagram of one example method (700) according to example aspects of the present disclosure. The method (700) will be discussed with reference to the processing apparatuses 100 or 600 of FIG. 1 or 3 by way of example. The method (700) can be implemented in any suitable processing apparatus. FIG. 12 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a processing apparatus 100. For instance, the method can include placing a workpiece 114 onto workpiece support 112 in the processing chamber 110 of FIG. 1. The workpiece 114 can include one or more layers comprising silicon, silicon dioxide, silicon carbide, one or more metals, one or more dielectric materials, or combinations thereof.

At (704), optionally, the method includes admitting a process gas to the processing chamber 110. For example, the process gas can be admitted to the processing chamber 110 via the gas delivery system 155 including the gas showerhead assembly 500. For example, the process gas can include oxygen-containing gases (e.g. $O_2$, $O_3$, $N_2O$, $H_2O$), hydrogen-containing gases (e.g., $H_2$, $D_2$), nitrogen-containing gases (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. In some embodiments, the process gas can be mixed with an inert gas, such as a carrier gas, such as He, Ar, Ne, Xe, or $N_2$. A control valve 158 can be used to control a flow rate of each feed gas line to flow a process gas into the processing chamber 110. A gas flow controller 185 can be used to control the flow of process gas.

At (706) the method includes controlling a vacuum pressure in the processing chamber 110. For example, one or more gases can be evacuated from the processing chamber 110 via one or more gas exhaust ports 921. Further, controller 175 can also implement one or more process parameters, altering conditions of the processing chamber 110 in order to maintain a vacuum pressure in the processing chamber 110 during processing of the workpiece 114. For example, as process gases are introduced in the processing chamber 110, controller 175 can implement instructions to remove process gases from the processing chamber 110, such that a desired vacuum pressure can be maintained in the processing chamber 110. The controller 175 can include, for instance, one or more processors and one or more memory devices. The one or more memory devices can store computer-readable instructions that when executed by the one or more processors cause the one or more processors to perform operations, such as any of the control operations described herein.

At (708) the method includes emitting radiation directed at one or more surfaces of the workpiece, such as a back side of the workpiece, to heat the workpiece. For example, heat sources 140 including one or more heating lamps 141 can emit thermal radiation to heat workpiece 114. In some embodiments, for example, heat sources 140 can be broadband thermal radiation sources including arc lamps, incandescent lamps, halogen lamps, any other suitable heating lamp, or combinations thereof. In some embodiments, heat sources 140 can be monochromatic radiation sources including light-emitting diodes, laser diodes, any other suitable heating lamps, or combinations thereof. In certain embodiments, directive elements, such as for example, reflectors (e.g., mirrors) can be configured to direct thermal radiation from one or more heating lamps 141 towards a workpiece 114 and/or workpiece support 112. The one or more heat sources 140 can be disposed on the bottom side of the processing chamber 110 in order to emit radiation at the back side of the workpiece 114 when it is atop the workpiece support 112.

At (710), optionally, the method includes emitting radiation directed at one or more surfaces of the workpiece 114, such as a top side of the workpiece 114, to heat the workpiece 114. For example, as shown in FIG. 4, the processing apparatus 600 can include one or more heat sources 140 disposed on the top side of the processing chamber 110 in order to emit radiation at a top side of the workpiece 114 when it is atop the workpiece support 112. The one or more heat sources 140 can include one or more heating lamps 141. Example heat sources 140 can include those previously described herein. In certain embodiments, directive elements, such as for example, reflectors (e.g., mirrors) can be configured to direct radiation from one or more heating lamps 141 towards a workpiece 114 and/or workpiece support 112.

In certain embodiments, the workpiece 114 can be rotated in the processing chamber 110 during heating of the workpiece 114. For example, the rotation shaft 900 coupled to the workpiece support 112, can be used to rotate the workpiece 114 in the processing chamber 110.

At (711), the method includes distributing process gas to the processing chamber 110 to expose the workpiece 114 to the process gas. For instance, a top side of the workpiece 114 can be exposed to process gas via the gas showerhead assembly 500. For example, in certain embodiments, after heating the workpiece 114, the workpiece 114 needs to be cooled to a certain temperature. Accordingly, one or more process gases can be distributed via the gas showerhead assembly 500 in order to reduce the temperature of the workpiece 114. In other processes, process gas can be distributed via the gas showerhead assembly 500 in order to facilitate further processing of the workpiece 114, such as chemical vapor deposition processing or etch processing.

At (712), optionally, the method includes obtaining a temperature measurement indicative of a temperature of the workpiece 114. For example, one or more temperature measurement devices 167,168, sensors 166, and/or emitters 150 can be used to obtain a temperature measurement indicative of a temperature of the workpiece 114. For example, in embodiments the temperature measurement can be obtained by: emitting, by one or more emitters, a calibration radiation at one or more surfaces of the workpiece; measuring, by one or more sensors, a reflected portion of the calibration radiation emitted by the one or more emitters and reflected by the one or more surfaces of the workpiece; and determining, based at least in part on the reflected portion, reflectivity of the workpiece 114. In some embodiments, the workpiece reflectivity measurement can be obtained by modulating at least one of the one or more emitters at a pulsing frequency; and isolating at least one measurement from the one or more sensors based at least in part on the pulsing frequency. The emissivity of the workpiece 141 can be determined from reflectivity of the workpiece 141. In some other embodiments, one or more sensors can be used to obtain a direct radiation measurement from the workpiece 114. One or more windows can be used to block at least a portion of broadband radiation emitted by the one or more heating lamps 141 from being incident on the temperature measurement devices 167,168 and reflectance sensor 166. The temperature of the workpiece 114 can be determined from radiation and emissivity of the workpiece 114.

At (714) process gas flow into the processing chamber is stopped and radiation emittance of heat source 140 is stopped, thus ending workpiece processing.

At (716) the method includes removing the workpiece 114 from the processing chamber 110. For instance, workpiece 114 can be removed from workpiece support 112 in processing chamber 110. The processing apparatus can then be conditioned for future processing of additional workpieces.

Figure 13:
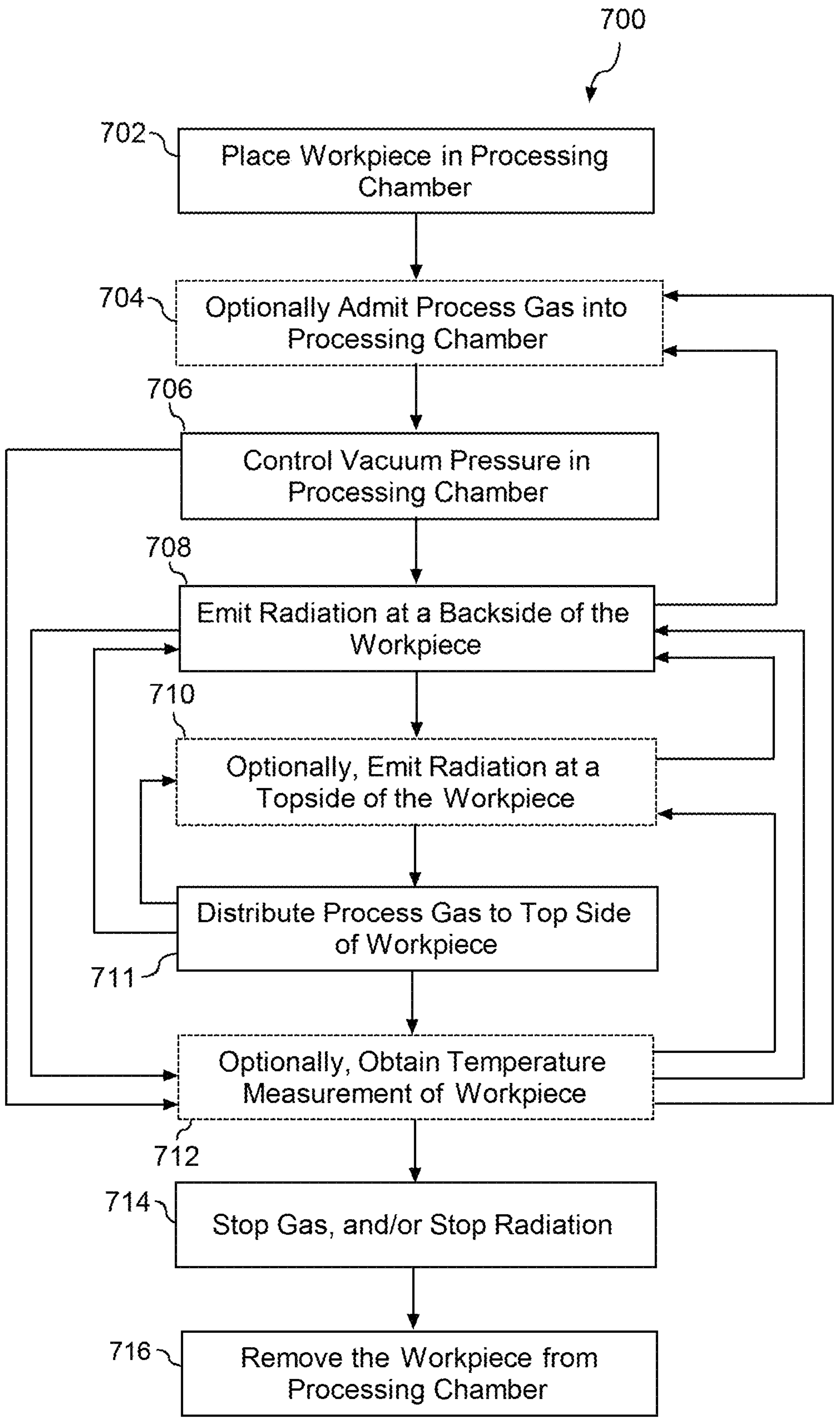
FIG. 13 depicts an example flowchart of a method according to example aspects of the present disclosure.

In embodiments, as indicated by the various arrows in FIG. 13 the method can include the listed steps in a variety of orders or combinations. For example, in certain embodiments the workpiece 114 is placed in the processing chamber 110 and exposed to radiation prior to admitting a process gas into the processing chamber 110. Further, the radiation can be emitted at the back side of the workpiece 114 and the top side of the workpiece 114 in alternating fashion, or radiation can be simultaneously emitted at the top side and the back side of the workpiece 114 in the processing chamber110. Process gas can be admitted into the processing chamber 110 while radiation is emitted at either the top side or the back side of the workpiece 114. Further, a vacuum pressure can be maintained in the processing chamber 110 while process gas is admitted to the processing chamber 110, radiation is emitted at the top side or back side of the workpiece 114, and/or temperature measurements are obtained. Additionally, emitting radiation at the workpiece 114 and distributing process gas to the topside of the workpiece can be alternated in a cyclical fashion until desired processing attributes are acquired.

Moreover, emitting radiation at the workpiece and the exposing the top side of the workpiece to process gases from the showerhead assembly for more rapid cooling of the workpiece can be cyclically alternated until desired processing attributes are acquired. Use of the gas showerhead assembly in order to cool the workpiece in between radiation cycles, can reduce overall processing time.

Further aspects of the invention are provided by the subject matter of the following clauses:

A method for processing a workpiece in a processing apparatus, the workpiece comprising a top side and a back side, the method comprising: placing the workpiece on a workpiece support disposed in a processing chamber; emitting, by one or more radiative heat sources, radiation directed at one or more surfaces of a workpiece to heat at least a portion of a surface of the workpiece; distributing, by a gas showerhead assembly, one or more process gases towards the top side of the workpiece; and obtaining a temperature measurement indicative of a temperature of the workpiece, wherein the gas showerhead assembly is transparent to electromagnetic radiation emitted from the one or more radiative heat sources, wherein the gas showerhead assembly comprises one or more gas diffusion mechanisms to distribute gas within the enclosure.

The method of any preceding clause, wherein the gas showerhead assembly comprises quartz.

The method of any preceding clause, wherein emitting, by one or more radiative heat sources, radiation directed at one or more surfaces of a workpiece comprises emitting radiation at a top side of the workpiece.

The method of any preceding clause, wherein emitting, by one or more radiative heat sources, radiation directed at one or more surfaces of a workpiece comprises emitting radiation at a back side of the workpiece.

The method of any preceding clause, removing gas from the processing chamber using one or more exhaust ports.

The method of any preceding clause, further comprising disposing a pumping plate around the workpiece, the pumping plate providing one or more channels for the directing a flow of process gas through the processing chamber.

The method of any preceding clause, wherein the process gas comprise an oxygen-containing gas, a hydrogen-containing gas, a nitrogen-containing gas, a hydrocarbon-containing gas, a fluorine-containing gas, or combinations thereof.

The method of any preceding clause, wherein obtaining a measurement indicative of a reflectivity of the workpiece, comprises: emitting, by one or more emitters, a calibration radiation at one or more surfaces of the workpiece; measuring, by one or more sensors, a reflected portion of the calibration radiation emitted by the one or more emitters and reflected by the one or more surfaces of the workpiece; and determining, based at least in part on the reflected portion, a reflectivity of the workpiece.

The method of any preceding clause, wherein the method further comprises: modulating the calibration radiation emitted by the one or more emitters at a pulsing frequency; and isolating at least one measurement from the one or more sensors based at least in part on the pulsing frequency.

The method of any preceding clause, further comprising: blocking, by one or more windows, at least a portion of broadband radiation emitted by one or more heating lamps configured to heat the workpiece from being incident on one or more sensors.

The method of any preceding clause, further comprising stopping the flow of process gas or emitting radiation.

The method of any preceding clause, further comprising removing the workpiece from the processing chamber.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A processing apparatus for processing a workpiece, the workpiece having a top side and a back side opposite from the top side, the processing apparatus comprising:

a processing chamber, having a first side and a second side opposite from the first side of the processing chamber;

a workpiece support disposed within the processing chamber, the workpiece support configured to support the workpiece, wherein the back side of the workpiece faces the workpiece support;

a gas delivery system configured to flow one or more process gases into the processing chamber from the first side of the processing chamber through a gas showerhead assembly, the gas showerhead assembly comprising an enclosure having a top cover and a plurality of gas injection apertures, wherein the gas delivery system comprises a first radial gas distribution channel and a first radial gas injection barrier, wherein gas flowing radially around the first radial gas distribution channel can diffuse or flow through one or more gas diffusion apertures disposed in the first radial gas injection barrier, the gas diffusion apertures configured to facilitate horizontal flow of the one or more process gases; and one or more radiative heat sources configured to heat the workpiece;

wherein the gas showerhead assembly is transparent to electromagnetic radiation emitted from the one or more radiative heat sources;

wherein the gas showerhead assembly comprises a gas distribution plate, the gas distribution plate including a plurality of gas diffusion barriers disposed generally perpendicular to a horizontal axis of the gas distribution plate such that each of the plurality of gas diffusion barriers extends from the gas distribution plate to a region between the gas distribution plate and the top cover of the enclosure such that gaps are between each of the gas diffusion barriers and the top cover of the enclosure; and wherein the gas showerhead assembly further comprises a gas injection port located radially outward of the first radial gas distribution channel, wherein the gas injection port is configured to provide the one or more process gases into the enclosure.

2. The processing apparatus of claim 1, wherein the gas delivery system further comprises a second radial gas injection barrier, wherein the first radial gas injection barrier is disposed radially inward of the first radial gas distribution channel, wherein the second radial gas injection barrier is disposed radially inward from the first radial gas injection barrier.

3. The processing apparatus of claim 2, wherein the second radial gas injection barrier comprises at least three times more gas diffusion apertures as compared to the first radial gas injection barrier, wherein the gas diffusion apertures of the second radial gas injection barrier are configured to facilitate horizontal flow of the one or more process gases.

4. The processing apparatus of claim 1, wherein the one or more gas injection barriers are disposed radially inward of the plurality of gas injection apertures.

5. The processing apparatus of claim 1, wherein the one or more gas distribution plates are disposed such that the plurality of gas injection apertures are in vertical alignment.

6. The processing apparatus of claim 1, wherein the one or more gas distribution plates comprise quartz.

7. The processing apparatus of claim 1, wherein the one or more gas distribution plates comprises a first gas distribution plate and a second gas distribution plate disposed in a stacked arrangement, forming the enclosure therebetween.

8. The processing apparatus of claim 7, wherein the one or more gas distribution plates comprise a third gas distribution plate, the third gas distribution plate disposed between the first gas distribution plate and the second gas distribution plate.

9. The processing apparatus of claim 1, wherein the enclosure has an enclosure diameter that is larger than a workpiece diameter.

10. The processing apparatus of claim 1, wherein the gas showerhead assembly comprises quartz.

11. The processing apparatus of claim 1, wherein the one or more radiative heat sources are disposed on the first side of the processing chamber, the one or more radiative heat sources configured to heat the workpiece from the top side of the workpiece.

12. The processing apparatus of claim 11, wherein the gas showerhead assembly is disposed between the one or more radiative heat sources disposed on the first side of the processing chamber and the top side of the workpiece.

13. The processing apparatus of claim 1, wherein the one or more radiative heat sources are disposed on the second side of the processing chamber, the one or more radiative heat sources configured to heat the workpiece from the back side of the workpiece.

14. The processing apparatus of claim 1, comprising a rotation system configured to rotate the workpiece support.

* * * * *